US009472487B2

(12) United States Patent
Koontz et al.

(10) Patent No.: US 9,472,487 B2
(45) Date of Patent: Oct. 18, 2016

(54) FLEXIBLE ELECTRONIC PACKAGE INTEGRATED HEAT EXCHANGER WITH COLD PLATE AND RISERS

(75) Inventors: Christopher R. Koontz, Manhattan Beach, CA (US); Charles Chu, Temple City, CA (US); Gilbert A. Flores, Redondo Beach, CA (US)

(73) Assignee: Raytheon Company, Waltham, MA (US)

( * ) Notice: Subject to any disclaimer, the term of this patent is extended or adjusted under 35 U.S.C. 154(b) by 619 days.

(21) Appl. No.: 13/558,807

(22) Filed: Jul. 26, 2012

(65) Prior Publication Data

US 2013/0255925 A1    Oct. 3, 2013

Related U.S. Application Data

(60) Provisional application No. 61/619,158, filed on Apr. 2, 2012.

(51) Int. Cl.
*F28F 7/00* (2006.01)
*H01L 23/433* (2006.01)
(Continued)

(52) U.S. Cl.
CPC .......... *H01L 23/4332* (2013.01); *H01L 23/473* (2013.01); *H05K 7/20254* (2013.01);
(Continued)

(58) Field of Classification Search
CPC ............ H01L 23/473; H05K 7/20509; H05K 7/20254
USPC .............. 361/679.53–679.54, 699, 702, 704; 257/712–714, 716, 718–719, 257/E23.097–E23.098, E23.101–E23.102, 257/E23.104, 693; 165/80.4, 168
See application file for complete search history.

(56) References Cited

U.S. PATENT DOCUMENTS

| 4,644,385 A | 2/1987 | Nakanishi et al. |
| 4,747,450 A | 5/1988 | Ikegame et al. |

(Continued)

FOREIGN PATENT DOCUMENTS

| EP | 1739746 A3 | 1/2007 | |
| EP | 2166569 A1 * | 3/2010 | ........... H01L 23/467 |

(Continued)

OTHER PUBLICATIONS

EP 2,166,569 A1 desciption machine translation.*

(Continued)

*Primary Examiner* — Len Tran
*Assistant Examiner* — Gordon Jones
(74) *Attorney, Agent, or Firm* — Burns & Levinson LLP; Joseph M. Maraia

(57) ABSTRACT

In some embodiments, a semiconductor cooling apparatus includes a heat exchanger configured to thermally couple to a semiconductor element to transfer heat to coolant flowing through the heat exchanger. The apparatus also includes a flexible coolant supply manifold and a flexible coolant return manifold. The flexible coolant supply manifold and flexible coolant return manifold flex to conform to a height of the semiconductor element to apply a force to maintain the thermal coupling between the heat exchanger and the semiconductor element. The apparatus also includes a cold plate located under the semiconductor element, the cold plate configured to couple to the flexible coolant supply manifold via a first riser to provide coolant to the flexible coolant supply manifold and configured to couple to the flexible coolant return manifold via a second riser to exhaust returned coolant to the cold plate.

16 Claims, 4 Drawing Sheets

(51) Int. Cl.
*H05K 7/20* (2006.01)
*H01L 23/473* (2006.01)

(52) U.S. Cl.
CPC . *H05K7/20509* (2013.01); *H01L 2224/16225* (2013.01); *H01L 2224/32225* (2013.01); *H01L 2224/73204* (2013.01); *H01L 2924/15311* (2013.01)

(56) References Cited

U.S. PATENT DOCUMENTS

| | | | | |
|---|---|---|---|---|
| 4,791,983 | A * | 12/1988 | Nicol et al. | 165/80.4 |
| 4,977,444 | A | 12/1990 | Nakajima et al. | |
| 5,125,451 | A | 6/1992 | Matthews | |
| 5,150,274 | A | 9/1992 | Okada et al. | |
| 5,166,863 | A | 11/1992 | Shmunis | |
| 5,177,667 | A * | 1/1993 | Graham | H01L 23/4336 257/714 |
| 5,294,830 | A * | 3/1994 | Young et al. | 257/714 |
| 5,329,419 | A | 7/1994 | Umezawa | |
| 5,465,192 | A * | 11/1995 | Yoshikawa | 361/705 |
| 5,777,384 | A * | 7/1998 | Root et al. | 257/712 |
| 6,111,749 | A | 8/2000 | Lamb et al. | |
| 6,212,074 | B1 | 4/2001 | Gonsalves et al. | |
| 6,448,575 | B1 | 9/2002 | Slocum et al. | |
| 6,595,270 | B2 | 7/2003 | Machiroutu et al. | |
| 6,778,393 | B2 | 8/2004 | Messina et al. | |
| 6,867,973 | B2 | 3/2005 | Chang | |
| 6,970,355 | B2 | 11/2005 | Ellsworth, Jr. et al. | |
| 7,102,889 | B1 * | 9/2006 | Barsun | 361/704 |
| 7,187,549 | B2 * | 3/2007 | Teneketges et al. | 361/699 |
| 7,385,817 | B2 * | 6/2008 | Campbell et al. | 361/699 |
| 7,385,821 | B1 * | 6/2008 | Feierbach | 361/705 |
| 7,397,665 | B2 * | 7/2008 | Yuval | 361/719 |
| 7,515,418 | B2 | 4/2009 | Straznicky et al. | |
| 7,518,875 | B2 * | 4/2009 | Desrosiers et al. | 361/719 |
| 7,624,789 | B2 * | 12/2009 | Minamitani | G06F 1/203 165/104.33 |
| 7,624,791 | B2 | 12/2009 | Strobel et al. | |
| 7,652,884 | B2 | 1/2010 | Suzuki et al. | |
| 7,863,738 | B2 * | 1/2011 | Romig | H01L 24/36 257/675 |
| 8,363,413 | B2 * | 1/2013 | Paquette et al. | 361/702 |
| 8,368,208 | B2 * | 2/2013 | Johnson | H01L 23/433 257/706 |
| 8,891,235 | B2 * | 11/2014 | Walczyk | F28F 9/007 165/80.3 |
| 2005/0085018 | A1 | 4/2005 | Kim et al. | |
| 2005/0269665 | A1 | 12/2005 | Wylie et al. | |
| 2006/0261469 | A1 | 11/2006 | Ni et al. | |
| 2007/0000655 | A1 | 1/2007 | Uchida et al. | |
| 2007/0126103 | A1 | 6/2007 | Shi | |
| 2008/0245506 | A1* | 10/2008 | Campbell et al. | 165/80.4 |
| 2009/0108429 | A1 | 4/2009 | Tsao et al. | |
| 2010/0155932 | A1 | 6/2010 | Gambino et al. | |
| 2012/0080785 | A1 | 4/2012 | Johnson et al. | |

FOREIGN PATENT DOCUMENTS

| | | |
|---|---|---|
| JP | 61226946 | 10/1986 |
| JP | 62118553 | 5/1987 |
| JP | 05/251601 A | 9/1993 |
| WO | 2010096355 A2 | 8/2010 |
| WO | 2011017385 A1 | 2/2011 |
| WO | 2011038184 A1 | 3/2011 |
| WO | 2011044445 A1 | 4/2011 |

OTHER PUBLICATIONS

Notice of Preliminary Rejection from Korean Application No. 10-2015-7024972 issued Jun. 27, 2016.
Notice of Reasons for Rejection from Japanese Application No. 2016-500123 issued Jun. 28, 2016.

* cited by examiner

FLEXIBLE ELECTRONIC PACKAGE INTEGRATED HEAT EXCHANGER WITH COLD PLATE AND RISERS

RELATED APPLICATIONS

The present application claims priority to U.S. Provisional Patent Application No. 61/619,158, filed Apr. 2, 2012, which is incorporated in its entirety herein by reference.

GOVERNMENT RIGHTS

The invention was supported, in whole or in part, by a grant, Contract No. FA8650-04-G-0002-0001 from the U.S. Air Force. The U.S. Government may have certain rights in the invention.

BACKGROUND

A flat aluminum or copper alloy brazed monolithic cooling apparatus can be used with conformal low thermal performance heat spreaders, such as a gap pad or gap filler material, to accommodate vertical height variations in semiconductors and individual variations in planarity with respect to the cooling apparatus surface. This solution, generally, is effective for low power semiconductors (<10 watts), but, generally, this solution is not effective for semiconductor assemblies with various vertical height variations due to the inefficiency of the heat spreaders and the difficulties of accurately mapping and fitting the custom heat spreaders.

Alternatively, a flat aluminum or copper alloy cooling apparatus can be used with helical or leaf springs and thermal interface materials such as thermal grease to accommodate vertical height variations in semiconductors and individual variations in planarity with respect to the cooling apparatus surface as a datum. This solution, generally, is effective for assemblies with minimal size and weight restrictions, but, generally, this solution is not effective for semiconductor assemblies with size and weight constraints due to the size and rigidity of fluidic interconnects and the springs necessary to enable the vertical height displacement.

Thus, a need exists in the art for a semiconductor cooling apparatus with the features as described herein.

SUMMARY

One approach to a semiconductor cooling apparatus includes a cooling element configured to thermally couple to a semiconductor element. The cooling element includes a heat exchanger configured to thermally couple to the semiconductor element to transfer heat from the semiconductor element to coolant flowing through the heat exchanger. The cooling element also includes a flexible coolant supply manifold coupled to an inlet of the heat exchanger for providing coolant to the heat exchanger and a flexible coolant return manifold coupled to an outlet of the heat exchanger for exhausting returned coolant from the heat exchanger. The flexible coolant supply manifold and flexible coolant return manifold flex to conform to a height of the semiconductor element to apply a force to maintain the thermal coupling between the heat exchanger and the semiconductor element. The cooling apparatus also includes a cold plate configured to couple to the flexible coolant supply manifold via a first riser to provide coolant to the flexible coolant supply manifold and configured to couple to the flexible coolant return manifold via a second riser to exhaust returned coolant to the cold plate.

In some embodiments, the first and second risers have internal passages for transporting coolant between the manifolds and cold plate. In some embodiments, the heat exchanger is spring loaded to the semiconductor element by attaching the flexible manifolds to the risers. In some embodiments, the cooling element is deformed at a junction between the heat exchanger and the supply and return manifolds to spring load the heat exchanger to the semiconductor element.

In some embodiments, the heat exchanger is coupled to the semiconductor element as a packaging lid. In some embodiments, the semiconductor cooling apparatus includes a coolant chilling apparatus connected to a coolant supply line and a coolant return line and configured to chill coolant and a coolant pump configured to pump the coolant between the coolant chilling apparatus and cold plate.

In some embodiments, the flexing of the flexible coolant supply manifold and the flexible coolant return manifold reduces a thermal resistance interface between the heat exchanger and the semiconductor element. In some embodiments, the semiconductor cooling apparatus includes a spring clip to couple the heat exchanger and the semiconductor element. In some embodiments, the semiconductor cooling apparatus includes aluminum, copper, stainless steel, titanium, alloys thereof, plastic, semiconductor fabrication materials, or any combination thereof.

In some embodiments, the cold plate is located adjacent to the semiconductor element. In some embodiments, the cold plate is located under the semiconductor element. In some embodiments, the cold plate is located above the flexible coolant supply manifold and flexible coolant return manifold.

Another approach to a semiconductor cooling apparatus includes a cooling element configured to thermally couple to a semiconductor element. The cooling element includes a heat exchanger configured to thermally couple to the semiconductor element to transfer heat from the semiconductor element to coolant flowing through the heat exchanger. The cooling element also includes a flexible coolant supply manifold coupled to an inlet of the heat exchanger for providing coolant to the heat exchanger. The cooling element also includes a flexible coolant return manifold coupled to an outlet of the heat exchanger for exhausting returned coolant from the heat exchanger. The cooling apparatus also includes a cold plate configured to couple to the flexible coolant supply manifold via a first riser to provide coolant to the flexible coolant supply manifold and configured to couple to the flexible coolant return manifold via a second riser to exhaust returned coolant to the cold plate. The flexible coolant supply manifold and flexible coolant return manifold flex to conform to a height of at least one of the semiconductor element or risers to apply a force to maintain the thermal coupling between the heat exchanger and the semiconductor element.

Another approach to a semiconductor cooling apparatus includes a cooling element configured to thermally couple to a semiconductor element. The cooling element includes a heat exchanger configured to thermally couple to the semiconductor element to transfer heat from the semiconductor element to coolant flowing through the heat exchanger. The cooling element also includes a flexible coolant supply manifold coupled to an inlet of the heat exchanger for providing coolant to the heat exchanger. The cooling element also includes a flexible coolant return manifold coupled to an outlet of the heat exchanger for exhausting returned coolant from the heat exchanger. The flexible coolant supply manifold and flexible coolant return manifold flex to conform to a height of the semiconductor element to apply a force to maintain the thermal coupling between the heat exchanger and the semiconductor element. The cooling apparatus also includes a cold plate configured to couple to the flexible coolant supply manifold to provide coolant to the flexible coolant supply manifold and configured to couple to the flexible coolant return manifold to exhaust returned coolant to the cold plate.

Another approach to a cooling apparatus includes a cooling element configured to thermally couple to an object. The cooling element includes a heat exchanger configured to thermally couple to the object to transfer heat from the object to coolant flowing through the heat exchanger. The cooling element also includes a flexible coolant supply manifold coupled to an inlet of the heat exchanger for providing coolant to the heat exchanger. The cooling element also includes a flexible coolant return manifold coupled to an outlet of the heat exchanger for exhausting returned coolant from the heat exchanger. The flexible coolant supply manifold and flexible coolant return manifold flex to conform to a height of the object to apply a force to maintain the thermal coupling between the heat exchanger and the object. The cooling apparatus also includes a cold plate configured to couple to the flexible coolant supply manifold via a first riser to provide coolant to the flexible coolant supply manifold and configured to couple to the flexible coolant return manifold via a second riser to exhaust returned coolant to the cold plate.

The cooling methods and systems described herein (hereinafter "technology") can provide one or more of the following advantages. One advantage of the technology is that the flexibility in the cooling apparatus advantageously increases the heat transfer between the semiconductor element and the cooling apparatus, thereby extending the life of the semiconductor element by promoting proper cooling of the semiconductor element. The flexibility of the cooling apparatus advantageously reduces the installation time and cost by removing any needed individual customizations due to, for example, differences in height of semiconductor elements or mechanical assembly tolerances, thereby decreasing the overall cost of the devices associated with the semiconductor element while increasing the heat transfer. The monolithic construction of the semiconductor cooling apparatus allows for installation in volume, weight, and height constrained applications.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

DETAILED DESCRIPTION

Figure 1:
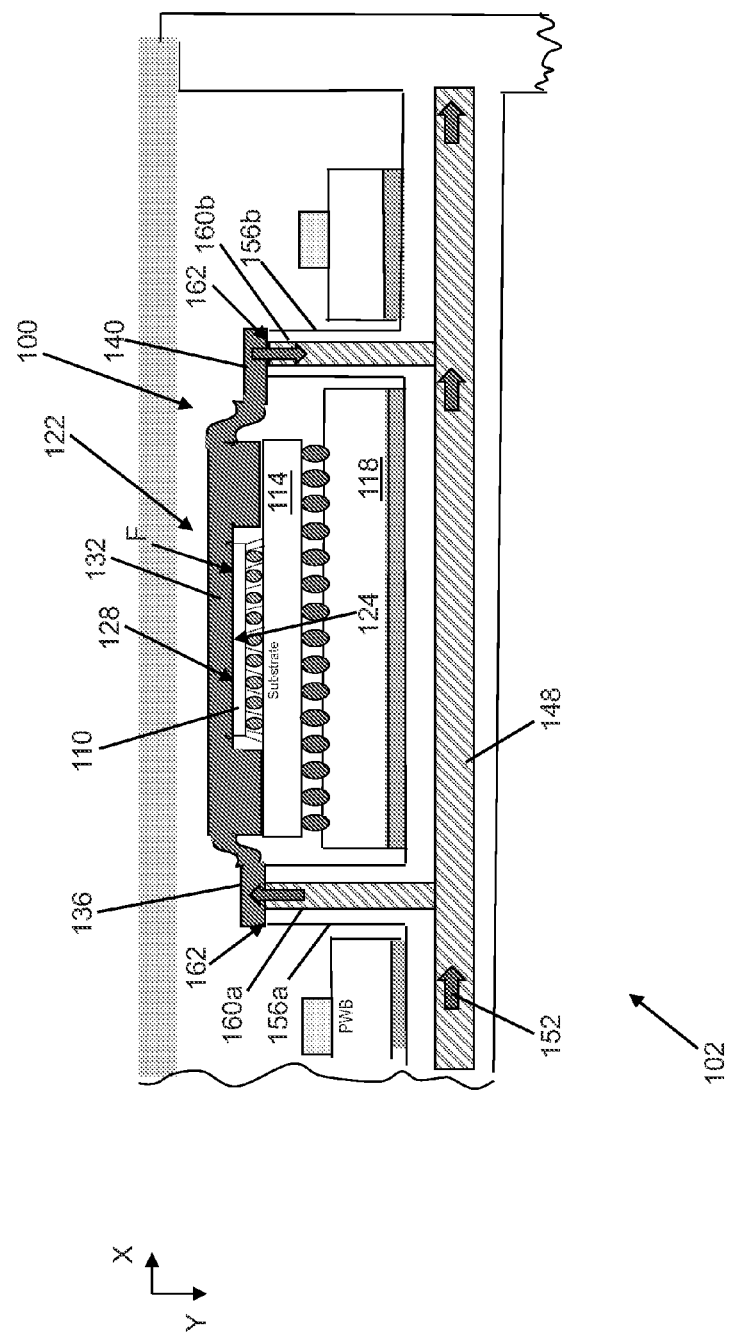
FIG. 1 is a schematic illustration of an exemplary semiconductor cooling apparatus.

Semiconductor elements, such as a ball grid array (BGA), can be used as part of aerospace sensor architectures and/or other semiconductor architectures. In most instances, each of the semiconductor elements is soldered to a primary circuit board (e.g., motherboard, array, etc.) creating a semiconductor array. Due to the size, spacing, and thermal properties of the semiconductor elements on the array, a semiconductor cooling apparatus is needed to quickly and efficiently transfer heat from each element. However, elements in the semiconductor array can vary in height due to manufacturing tolerances, making it difficult to effectively and consistently transfer heat from the semiconductor elements. It is also difficult to integrate coolant supply mechanisms into a semiconductor cooling apparatus because of the difficulty in routing coolant to a cooling element while maintaining a low profile and/or compact electronics system that incorporates the semiconductor element and cooling apparatus. Thus, the semiconductor cooling apparatus, as described herein, includes a flexible cooling element to thermally couple to a semiconductor element. The semiconductor cooling apparatus also includes a cold plate that effectively routes coolant to the cooling element and exhausts heated coolant received from the cooling element.

Advantageously, the monolithic cooling element can flex to conform to the height of a semiconductor element (e.g., a math coprocessor is 0.02 inches high and a video processor is 0.04 inches high, BGA applications are about 0.08 inches to about 0.14 inches, an input/output processor is 0.023 inches high and an encryption processor is 0.034 inches high, etc.), thereby increasing the thermal transfer between a semiconductor element and a cooling element. Each cooling element is able to cool a single component with height variations due to manufacturing tolerances. For example, BGA uses solder balls between the package and the board for passing electrical signals; the solder balls are melted when the BGA is installed. Every time a BGA is installed, that solder thickness varies. The cooling elements described mitigate height variations of the same part from unit to unit. The monolithic cooling elements described advantageously integrate a heat exchanger and flexible supply and return manifolds into a single component. Having a monolithic element eliminates the need for another fluidic interconnect to transfer the coolant from the heat exchanger to the flexible manifolds. Those fluidic interconnects are leaky and bulky. In some examples, a cooling element is formed through a bonding process to form the monolithic structure. In other examples, the bonding includes diffusion bonding, adhesive bonding, brazing, and/or any other type of bonding mechanism.

Effective cooling of semiconductor elements presents a unique thermal design problem due to variations in the physical dimensions of the semiconductor elements from one assembly to the next assembly and/or between production units. The semiconductor cooling apparatus as described herein can advantageously solve this thermal design problem by combining flexible cooling elements with coolant supply features that integrate both structural and hydraulic functions. The architecture of the semiconductor cooling apparatus (e.g., copper foil, copper alloy, etc.) can be thin enough to be strategically deformed along the coolant manifolds (e.g., coolant supply manifold, coolant return manifold, etc.) to enable each cooling element to flex independently for a respective semiconductor element.

FIG. 1 is a schematic illustration of an exemplary semiconductor cooling apparatus 100 for a semiconductor element 110 coupled to a substrate 114 in an electronics assembly 102. The substrate 114 is below the semiconductor element 110. The substrate is coupled to a printed wiring board (PWB) 118 below the substrate 114 (e.g., a ball grid array (BGA), computer motherboard, etc.). The semiconductor cooling apparatus 100 includes a flexible cooling element 122 that has a cooling surface 124 that is thermally coupled to (e.g., in thermal contact with) a surface 128 of the semiconductor element 110.

The flexibility of the cooling element 122 advantageously increases the heat transfer between the semiconductor element 110 and the cooling element 122, thereby extending the life of the semiconductor element 110 by promoting proper cooling of the semiconductor element 110. The flexibility of the cooling element 122 and/or design of the semiconductor cooling apparatus advantageously reduce the installation time and cost by removing any needed individual customization, thereby decreasing the overall cost of the devices associated with the semiconductor element 110 while increasing the heat transfer. The cooling elements described herein provide for improved thermal performance with minimal intrusion into the design and assembly in the form of weight, size, support hardware (e.g., plumbing hoses), reliable leak-free coolant interconnect simplicity.

The cooling element 122 includes a heat exchanger 132, a flexible coolant supply manifold 136, and a flexible coolant return manifold 140. In this embodiment, the heat exchanger is coupled to the semiconductor element 110 as a packaging lid (to, for example, encapsulate or otherwise house of protect the semiconductor element 110). The cooling element 122 can be attached to the semiconductor element 110 when the other components (e.g., substrate cold plate, risers) are assembled. Or, in some embodiments, the cooling element 122 is attached to the combination of the substrate 114 and the semiconductor element 110 at the facility where the semiconductor element 122 is fabricated; the combination is then delivered for final assembly.

The cooling apparatus 100 also includes a cold plate 148 located below the printed wiring board 118. Coolant 152 flows through the cold plate 148. The cooling apparatus 100 also includes two or more risers 156a and 156b (generally 156) that deliver coolant 152 to the cooling element 122 and exhaust returned coolant 152 from the cooling element 122. Riser 156a is coupled to the cold plate 148 and delivers chilled coolant to the flexible coolant supply manifold 136 via an internal passage 160a of the riser 156a. The flexible coolant supply manifold 136 delivers the coolant to the heat exchanger 132 and the heat exchanger 132 transfers heat from the semiconductor element 110 to the coolant flowing in the heat exchanger 132. The heated coolant is then exhausted from the heat exchanger 132 to the flexible coolant return manifold 140. The flexible coolant return manifold 140 then provides the returned coolant to the cold plate 148 via the internal passage 160b of the riser 156b. The exhausted coolant is then pumped to a coolant chilling apparatus (not shown) by a coolant pump (not shown) to chill the coolant. In some embodiments, the cooling apparatus 102 does not have risers 156a and 156b. The flexible coolant supply manifold 136 is coupled to the cold plate 148 and receives coolant from the cold plate 148. The flexible coolant return manifold 140 is coupled to the cold plate 148 to exhaust the heated coolant to the cold plate 148.

In some examples, the coolant includes single phase or two-phase coolants (e.g., where the liquid coolant evaporates in the heat exchanger). In some examples, the coolant includes single phase liquids (e.g., polyalphaolefin (PAO), Coolanol, water, glycol water mixtures (EGW, PGW), fuels (JP-5, JP-8)) and/or two-phase coolants (water, ammonia, methanol, Fluorinert, glycol water mixtures (EGW, PGW)).

In this embodiment, the cold plate 148 is located below the printed wiring board 118. However, in some embodiments, the cold plate 148 is not located below the printed wiring board 118. The cold plate 148 could be located above or next to/adjacent the printed wiring board 118. For example, in one embodiment, the system includes a 6-sided box where the printed wiring board is bonded to the base of the box which is solid metal, and coolant runs through one or more side walls of the box. The flexible manifolds are bent 90-degrees to couple to the cold plate, or, risers extend out from the side of the box to enable fluidic and mechanical coupling to accomplish the principles described herein.

Referring to FIG. 1, the risers 156 can be, for example, posts or other structures extending from a surface of the cold plate 148. The risers 156 can be, for example, bonded to the cold plate 148. The flexible coolant supply manifold 136 and the flexible coolant return manifold 140 can be attached to the risers 156 by screws (as described further below) or otherwise coupled (e.g., by adhesive bonding, diffusion bonding) to the risers 156 by one or more alternative connection methods. The risers 156 can be manufactured using the same material as the cold plate 148, or other suitable material (e.g., plastic, rubber, metal, metal allow) that allows for coolant to be transmitted through the risers 156.

The heat exchanger 132 can be spring loaded to the semiconductor element 110 if the top surface 162 of the risers 156 is lower (in the positive direction of the Y-axis) than the top surface 128 of the semiconductor element 110. By attaching the flexible manifolds 136 and 140 to the risers, the heat exchanger 132 is deformed along the length of the supply and return manifolds 136 and 140. The deformation causes the cooling element 122 to be spring loaded to the semiconductor element 110 thereby applying a force to maintain the thermal coupling between the heat exchanger 132 and the semiconductor element 110. The force generated can be varied based on one or more of a variety of design parameters. The size and rigidity of the coolant supply and return elements and interconnects can be varied to define or alter the flexibility of the manifolds and the forces generated. If the deformation of a runner is elastic, the force is a function of the spring constant of the flexible manifolds and the displacement of the flexible manifolds (in accordance with F=kx, where F is the force, k is the spring constant, and x is the displacement). The spring constant can be changed or specified based on, for example, the material type of the flexible manifold, the wall thickness of the of the cooling element where the flexible manifolds are deformed, or another geometric property of the flexible manifold (e.g., length, width, thickness). In some embodiments, the runners 512 may be designed for plastic deformation instead of elastic deformation.

In some examples, the heat exchanger is fixed in space and the flexible manifolds flex to mate with the risers. In some embodiments, the flexible manifolds flex to enable the heat exchanger to mate with the semiconductor element. In some examples, the flexible properties of the cooling element 122 reduce a thermal interface resistance between the cooling element 122 and the semiconductor element 110. For example, the cooling element 122 flexes 0.030 inches to be in contact with the semiconductor element 122. The flexibility of the cooling element 122 advantageously enables the thermal resistance interface to be reduced (e.g., reduced thermal penalty from 20° C. to 10° C.; reduced thermal penalty from 8° C. to 3.2° C., etc.), thereby increasing the efficiency of the semiconductor cooling apparatus 100 and increasing the life of the semiconductor element 110.

In some examples, the semiconductor cooling apparatus (or portions of it) can be produced using aluminum, copper, stainless steel, titanium, alloys thereof, and/or material with high heat transfer (e.g., Glidcop® available from SCM Metal Products, Inc., a copper alloy, etc.). In some examples, the semiconductor cooling apparatus can be produced using plastic material or semiconductor fabrication materials (e.g., silicon).

The disclosed semiconductor cooling apparatus includes a monolithic cooling element configured to thermally couple to a semiconductor element. The monolithic cooling element includes a heat exchanger portion, a flexible coolant supply manifold and a flexible coolant return manifold. The heat exchanger portion is configured to thermally couple to the semiconductor element to transfer heat from the semiconductor element to coolant flowing through the heat exchanger portion. The heat exchanger portion includes a planar structure and a plurality of internal coolant paths extending through the planar structure between an inlet coolant path of the planar structure and an outlet coolant path of the planar structure.

Figure 2:
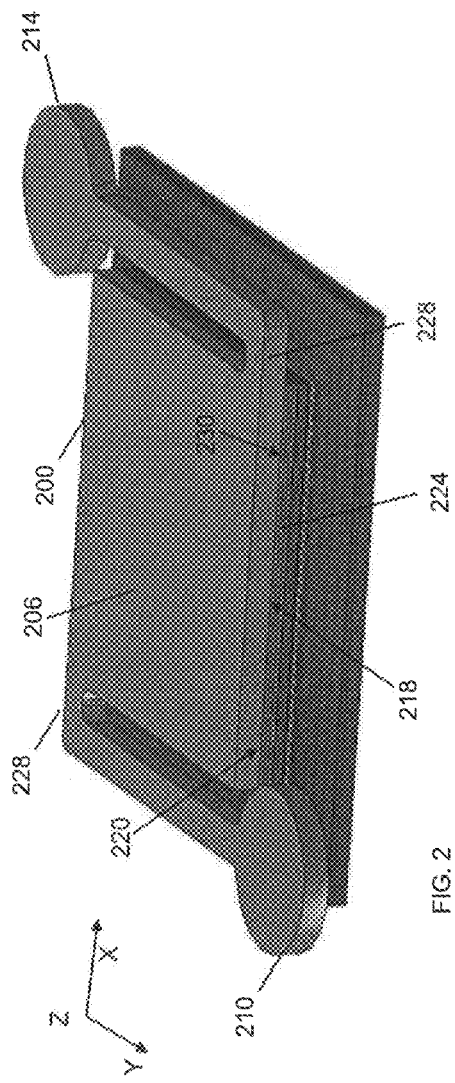
FIG. 2 is a schematic illustration of an exemplary cooling element of a semiconductor cooling apparatus.

The flexible coolant supply manifold is coupled to an inlet of the heat exchanger portion for providing coolant to the heat exchanger portion. Referring to FIG. 2, the flexible coolant supply manifold includes a first flexible arm portion 211 of the monolithic cooling element. The first flexible arm 211 portion includes a proximal end attached to the planar structure, a distal end separated by a first gap from the planar structure, and an internal inlet path. The internal inlet path extends from the distal end of the first flexible arm portion 211 to the proximal end of the first flexible arm portion 211 and is coupled to the inlet coolant path of the planar structure.

Similarly, the flexible coolant return manifold is coupled to an outlet of the heat exchanger portion for providing coolant to the heat exchanger portion. The flexible coolant return manifold includes a second flexible arm portion 215 of the monolithic cooling element. The second flexible arm portion 215 includes a proximal end attached to the planar structure, a distal end separated by a second gap from the planar structure, and an internal inlet path. The internal inlet path extends from the distal end of the second flexible arm portion 215 to the proximal end of the second flexible arm portion 215 and is coupled to the outlet coolant path of the planar structure.

Some embodiments of the semiconductor cooling apparatus also include a first riser coupled to a cold plate and attached to the distal end of the first flexible arm portion 211 and a second riser coupled to the cold plate and attached to the distal end of the second flexible arm portion 215. The first riser includes an internal fluid path between the cold plate and the distal end of the first flexible arm portion 211 and the second riser includes an internal fluid path between the cold plate and the distal end of the second flexible arm portion 215. In this example, a first deformed portion of the first flexible arm portion 211 conforms to a first height difference between the heat exchanger portion and the first riser, and a second deformed portion of the second flexible aim portion 215 conforms to a second height difference between the heat exchanger portion and the second riser.

FIG. 2 is a schematic illustration of an exemplary cooling element 200 of a semiconductor cooling apparatus (e.g., the cooling element 122 of FIG. 1). The cooling element 200 includes a heat exchanger 206, a flexible coolant supply manifold 210 and a coolant return manifold 214. The coolant supply manifold 210 and the coolant return manifold 214 are coupled to the heat exchanger 206 at junction 228. The coolant supply manifold 210 and the coolant return manifold 214 flex independent of the heat exchanger 206 along the length of the manifold. As illustrated in FIG. 2, the wrapping-around (in the X-Y plane) the coolant supply manifold 210 and the coolant return manifold 214 around the heat exchanger 206 advantageously enables the cooling element 200 to flex and pivot in 3-dimensions (i.e., along the X, Y and Z axes). The bottom surface 218 of the heat exchanger 206 is thermally coupled to the top surface 230 of the semiconductor element 224.

Figure 3:
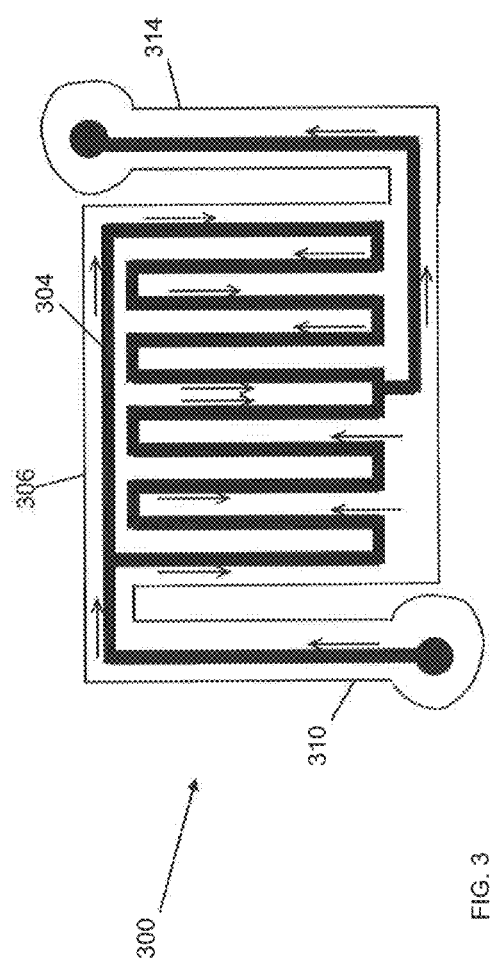
FIG. 3 is a schematic illustration of internal flow passages of an exemplary cooling element.

FIG. 3 is a schematic illustration of internal flow passages 304 of an exemplary cooling element 300 (e.g., the cooling element 200 of FIG. 2). The cooling element 300 has a flexible coolant supply manifold 310, a coolant return manifold 314, and a heat exchanger 306. An internal flow passage 304 of the flexible coolant supply manifold 310 provides coolant to the internal flow passages 304 of the heat exchanger 306. The coolant flows through the passages 304 of the heat exchanger 306 as illustrated by the arrows. Alternate numbers, sizes, and configurations of the passages can be used in different embodiments. For example, the number of passages 304 can be increased, and the spacing between passages can be decreased in some embodiments to cover a larger percentage of the total area of the heat exchanger 306 to increase the thermal exchange efficiency of the heat exchanger 306.

Figure 4:
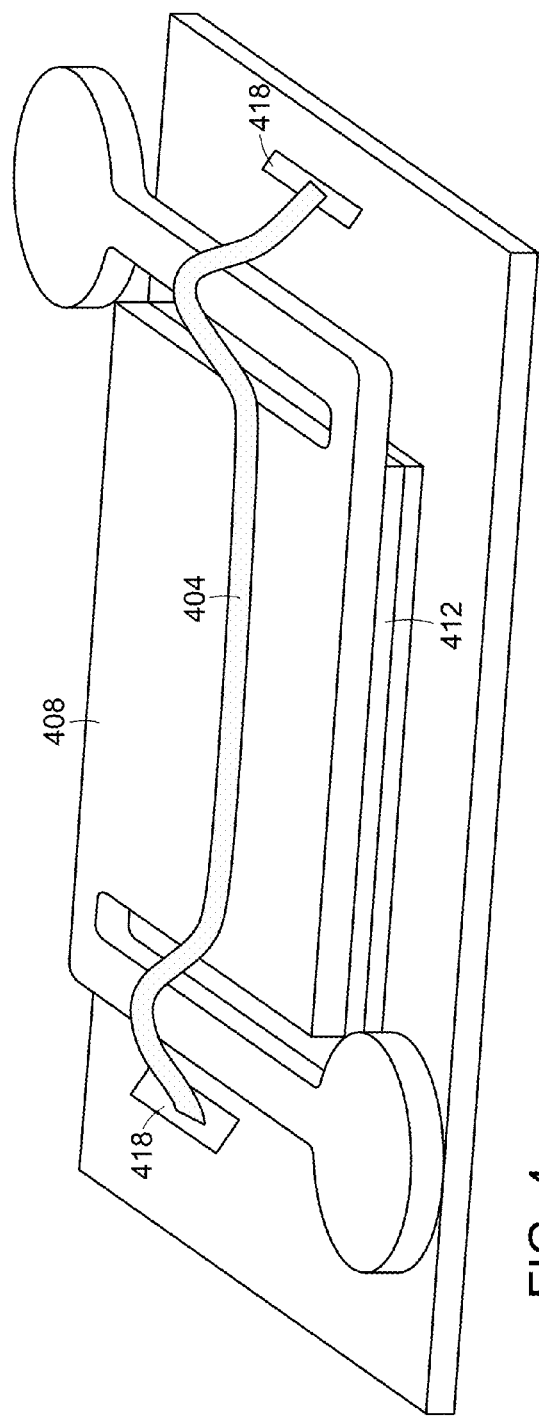
FIG. 4 is a schematic illustration of an exemplary fastener mounting a cooling element to a semiconductor element.

FIG. 4 is a perspective view of an exemplary fastener 404 coupling a cooling element 408 to a semiconductor element 412, according to an illustrative embodiment. In this embodiment, the fastener 404 is a spring clip that clips into two slots 418 on opposing sides of the cooling element 408. In some embodiments, the slots are located (e.g., formed or machined) in a cold plate (e.g., the cold plate 148 of FIG. 1) below the semiconductor element 412.

Figure 5:
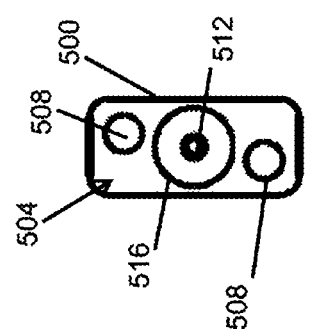
FIG. 5 is a schematic illustration of a mounting arrangement for an exemplary cooling element.

FIG. 5 is a schematic illustration of a mounting arrangement on a top surface 504 of a riser 500 of a cooling apparatus for an exemplary cooling element (e.g., top surface 162 of riser 156a of FIG. 1). The riser 500 includes two corner holes 508 that are threaded to accept screws. The riser 500 also includes a center hole 512 that provides access to the internal passage in the riser 500 (e.g., internal passage 160a of the riser 156a of FIG. 1). An o-ring 516 is located around the center hole 512 to provide a fluid seal between a flexible coolant manifold and the riser 500 when the flexible coolant manifold is coupled to the top surface 504 surface of the riser 500.

Figure 6:
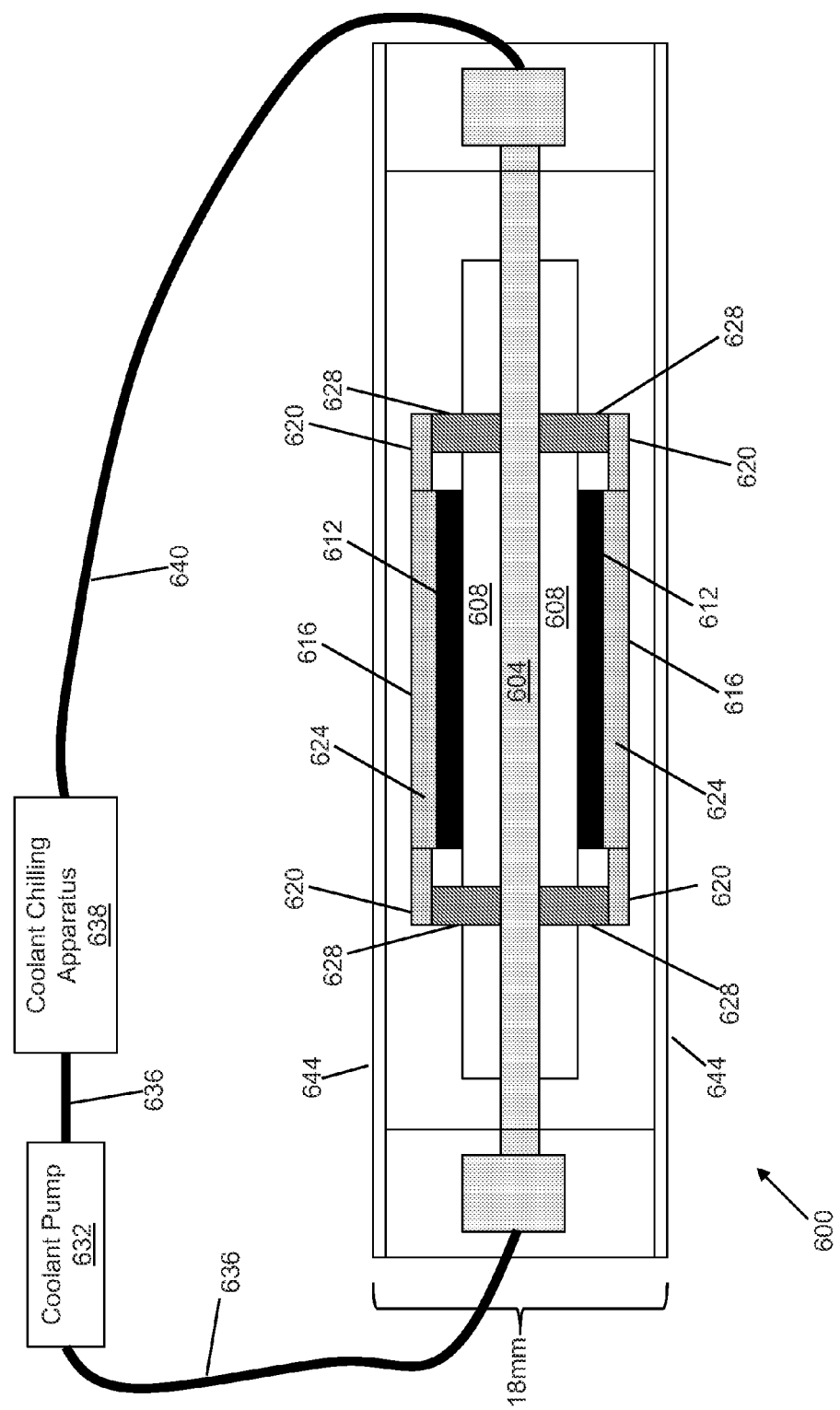
FIG. 6 is a schematic illustration of an electronics assembly incorporating a cooling apparatus, according to an illustrative embodiment.

FIG. 6 is a schematic cross-sectional view of an exemplary electronics assembly 600 that incorporates a cooling apparatus, according to an illustrative embodiment. The compact packaging afforded by the principles described advantageously allows for the assembly to be compact with a relatively low profile (e.g., 18 mm in this embodiment). The cooling apparatus includes a cold plate 604 located between two printed wire boards 608. A semiconductor element 612 is mounted to each printed wire board 608. The cooling apparatus also includes two cooling elements 616 (e.g., cooling element 200 of FIG. 2); one cooling element 616 is coupled to each of the semiconductor elements 612.

The heat exchanger 624 of the cooling element 616 is thermally coupled to each of the semiconductor elements 612. The supply and return cooling manifolds 620 of the cooling elements 616 are coupled to the risers 628, similarly as described with respect to the manifolds 136 and 140, and risers 156 of FIG. 1. The risers 628 are coupled to the cold plate 604. Coolant flowing through the cold plate 604 is delivered to the cooling elements and exhausted from the cooling elements via internal passages in the risers. The assembly includes two covers 644 that enclose the cold plate 604, printed wire boards 608, semiconductor elements 612, cooling elements 616, and the risers 628.

The cooling apparatus includes a coolant chilling apparatus 638 coupled to one or more coolant supply lines 636 and one or more coolant return lines 640. The coolant chilling apparatus 638 is configured to chill coolant. The cooling apparatus includes a coolant pump 632 that is configured to pump the coolant through the supply lines and various coolant passages in the cooling apparatus. The pump 632 pumps chilled coolant through the coolant supply line 636 which is directed to an input of the cold plate 604.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein. In addition, the figures and foregoing descriptions identify a semiconductor to be thermally coupled to the heat exchanger, but the art described herein is not limited to semiconductors and can apply to any object which requires temperature control through heat rejection or addition.

What is claimed is:

1. A semiconductor cooling apparatus, comprising:
    a monolithic cooling element configured to thermally couple to a semiconductor element, wherein the monolithic cooling element comprises:
        a heat exchanger portion configured to thermally couple to the semiconductor element to transfer heat from the semiconductor element to coolant flowing through the heat exchanger portion, the heat exchanger portion comprising a planar structure and a plurality of internal coolant paths extending through the planar structure between an inlet coolant path of the planar structure and an outlet coolant path of the planar structure;
        a flexible coolant supply manifold coupled to an inlet of the heat exchanger portion for providing coolant to the heat exchanger portion, the flexible coolant supply manifold comprising a first flexible arm portion of the monolithic cooling element, the first flexible arm portion comprising a proximal end attached to the planar structure, a distal end separated by a first gap from the planar structure, and an internal inlet path, the internal inlet path extending from the distal end of the first flexible arm portion to the proximal end of the first flexible arm portion and coupled to the inlet coolant path of the planar structure;
        a flexible coolant return manifold coupled to an outlet of the heat exchanger portion for providing coolant to the heat exchanger portion, the flexible coolant return manifold comprising a second flexible arm portion of the monolithic cooling element, the second flexible arm portion comprising a proximal end attached to the planar structure, a distal end separated by a second gap from the planar structure, and an internal inlet path, the internal inlet path extending from the distal end of the second flexible arm portion to the proximal end of the second flexible arm portion and coupled to the outlet coolant path of the planar structure,
    and
    a first riser coupled to a cold plate and attached to the distal end of the first flexible arm, the first riser comprising an internal fluid path between the cold plate and the distal end of the first flexible arm;
    a first deformed portion of the first flexible arm conforming to a first height difference between the heat exchanger portion and the first riser; and
    a second riser coupled to the cold plate and attached to the distal end of the second flexible arm, the second riser comprising an internal fluid path between the cold plate and the distal end of the second flexible arm; and
    a second deformed portion of the second flexible arm conforming to a second height difference between the heat exchanger portion and the second riser.

2. The semiconductor cooling apparatus of claim 1, wherein the heat exchanger portion is spring loaded to the semiconductor element by attaching the flexible manifolds to the risers.

3. The semiconductor cooling apparatus of claim 1, comprising:
    a first deformation of the monolithic cooling element at a junction of the heat exchanger portion to the supply manifold and a second deformation of the monolithic cooling element at a junction of the heat exchanger portion to the return manifold, wherein the first deformation and the second deformation apply a spring load between the heat exchanger portion and the semiconductor element.

4. The semiconductor cooling apparatus of claim 1, wherein the heat exchanger portion is coupled to the semiconductor element as a packaging lid.

5. The semiconductor cooling apparatus of claim 1, comprising:
    a coolant chilling apparatus connected to a coolant supply line and a coolant return line and configured to chill coolant; and
    a coolant pump configured to pump the coolant between the coolant chilling apparatus and the cold plate.

6. The semiconductor cooling apparatus of claim 1, further comprising a spring clip coupling the heat exchanger and the semiconductor element.

7. The semiconductor cooling apparatus of claim 1, wherein the semiconductor cooling apparatus comprises aluminum, copper, stainless steel, titanium, alloys thereof, plastic, semiconductor fabrication materials, or a combination thereof.

8. The semiconductor cooling apparatus of claim 1, wherein the cold plate is located adjacent to the semiconductor element.

9. The semiconductor cooling apparatus of claim 1, wherein the cold plate is located under the semiconductor element.

10. The semiconductor cooling apparatus of claim 1, wherein the cold plate is located above the flexible coolant supply manifold and flexible coolant return manifold.

11. The semiconductor cooling apparatus of claim 1, wherein the flexible coolant supply manifold and flexible coolant return manifold are flexed to conform to a height of one of a plurality of semiconductor elements or risers and apply a force that maintains the thermal coupling between the heat exchanger and the semiconductor element.

12. A semiconductor cooling apparatus, comprising:
a monolithic cooling element configured to thermally couple to a semiconductor element, wherein the monolithic cooling element comprises:
  a heat exchanger portion configured to thermally couple to the semiconductor element to transfer heat from the semiconductor element to coolant flowing through the heat exchanger portion, the heat exchanger portion comprising a planar structure and a plurality of internal coolant paths extending through the planar structure between an inlet coolant path of the planar structure and an outlet coolant path of the planar structure;
  a flexible coolant supply manifold coupled to an inlet of the heat exchanger portion for providing coolant to the heat exchanger portion, the flexible coolant supply manifold comprising a first flexible arm portion of the monolithic cooling element, the first flexible arm portion comprising a proximal end attached to the planar structure, a distal end separated by a first gap from the planar structure, and an internal inlet path, the internal inlet path extending from the distal end of the first flexible arm portion to the proximal end of the first flexible arm portion and coupled to the inlet coolant path of the planar structure;
  a flexible coolant return manifold coupled to an outlet of the heat exchanger portion for providing coolant to the heat exchanger portion, the flexible coolant return manifold comprising a second flexible arm portion of the monolithic cooling element, the second flexible arm portion comprising a proximal end attached to the planar structure, a distal end separated by a second gap from the planar structure, and an internal inlet path, the internal inlet path extending from the distal end of the second flexible arm portion to the proximal end of the second flexible arm portion and coupled to the outlet coolant path of the planar structure,
  wherein the flexible coolant supply manifold and flexible coolant return manifold are flexed to conform to a height of the semiconductor element and apply a force that maintains the thermal coupling between the heat exchanger and the semiconductor element; and
a cold plate configured to couple to the flexible coolant supply manifold to provide coolant to the flexible coolant supply manifold and configured to couple to the flexible coolant return manifold to exhaust returned coolant to the cold plate.

13. A cooling apparatus, comprising:
a monolithic cooling element configured to thermally couple to a semiconductor element, wherein the monolithic cooling element comprises:
  a heat exchanger portion configured to thermally couple to the semiconductor element to transfer heat from the semiconductor element to coolant flowing through the heat exchanger portion, the heat exchanger portion comprising a planar structure and a plurality of internal coolant paths extending through the planar structure between an inlet coolant path of the planar structure and an outlet coolant path of the planar structure;
  a flexible coolant supply manifold coupled to an inlet of the heat exchanger portion for providing coolant to the heat exchanger portion, the flexible coolant supply manifold comprising a first flexible arm portion of the monolithic cooling element, the first flexible arm portion comprising a proximal end attached to the planar structure, a distal end separated by a first gap from the planar structure, and an internal inlet path, the internal inlet path extending from the distal end of the first flexible arm portion to the proximal end of the first flexible arm portion and coupled to the inlet coolant path of the planar structure;
  a flexible coolant return manifold coupled to an outlet of the heat exchanger portion for providing coolant to the heat exchanger portion, the flexible coolant return manifold comprising a second flexible arm portion of the monolithic cooling element, the second flexible arm portion comprising a proximal end attached to the planar structure, a distal end separated by a second gap from the planar structure, and an internal inlet path, the internal inlet path extending from the distal end of the second flexible arm portion to the proximal end of the second flexible arm portion and coupled to the outlet coolant path of the planar structure,
  wherein the flexible coolant supply manifold and flexible coolant return manifold are flexed to conform to a height of the semiconductor element and apply a force that maintains the thermal coupling between the heat exchanger and the semiconductor element; and
a cold plate configured to couple to the flexible coolant supply manifold via a first riser to provide coolant to the flexible coolant supply manifold and configured to couple to the flexible coolant return manifold via a second riser to exhaust returned coolant to the cold plate.

14. The semiconductor cooling apparatus of claim 1, wherein the flexible coolant supply manifold and flexible coolant return manifold are in-plane with the heat exchanger portion.

15. The semiconductor cooling apparatus of claim 1, wherein the flexible coolant supply manifold and flexible coolant return manifold mechanically couple the heat exchanger portion to the cold plate.

16. The semiconductor cooling apparatus of claim 1, wherein a first spring force caused by flexing of the coolant supply manifold and a second spring force caused by flexing of the flexible coolant return manifold engage the heat exchanger portion to the semiconductor element.

* * * * *